US007109037B2

(12) United States Patent
Nakagawa et al.

(10) Patent No.: US 7,109,037 B2
(45) Date of Patent: Sep. 19, 2006

(54) WATER-BASED RESIST STRIPPING LIQUID MANAGEMENT APPARATUS AND WATER-BASED RESIST STRIPPING LIQUID MANAGEMENT METHOD

(75) Inventors: Toshimoto Nakagawa, Kawasaki (JP); Yuko Katagiri, Kawasaki (JP); Shu Ogawa, Tokyo (JP); Satoru Morita, Tokyo (JP); Makoto Kikukawa, Yokohama (JP)

(73) Assignees: Nagase & Co., Ltd., Osaka (JP); Hirama Laboratories Co., Ltd., Kanagawa (JP); Nagase CMS Technology Co., Ltd., Tokyo (JP)

( * ) Notice: Subject to any disclaimer, the term of this patent is extended or adjusted under 35 U.S.C. 154(b) by 492 days.

(21) Appl. No.: 10/183,833

(22) Filed: Jun. 25, 2002

(65) Prior Publication Data

US 2002/0197869 A1    Dec. 26, 2002

(30) Foreign Application Priority Data

Jun. 25, 2001    (JP) .......................... P2001-191703

(51) Int. Cl.
  *G01N 33/18*    (2006.01)
  *G01N 35/08*    (2006.01)
  *G01N 27/00*    (2006.01)
  *G01N 21/00*    (2006.01)

(52) U.S. Cl. .......................... 436/39; 436/55; 436/149; 436/164

(58) Field of Classification Search ................ 436/50, 436/55, 149, 150; 510/175, 176; 422/82.01, 422/82.02, 82.105, 82.05
See application file for complete search history.

(56) References Cited

U.S. PATENT DOCUMENTS 5,896,874 A    4/1999 Nakagawa et al.

6,235,641 B1    5/2001 Christenson

FOREIGN PATENT DOCUMENTS

| JP | 7-235487 | 9/1995 |
|---|---|---|
| JP | 10-22261 | 1/1998 |
| JP | 10-022261 | 1/1998 |
| JP | 11-133630 | 5/1999 |
| JP | 2000-338684 | 12/2000 |
| JP | 2001-223153 | 8/2001 |

OTHER PUBLICATIONS

Hideo et al., JP 2000-338684, Dec. 8, 2000, computer translation.*

(Continued)

*Primary Examiner*—Yelena G. Gakh
(74) *Attorney, Agent, or Firm*—Osha Liang L.L.P.

(57) ABSTRACT

The water-based resist stripping liquid management apparatus according to the present invention manages in an adjusting bath a water-based resist stripping liquid that is used in resist stripping equipment. In this apparatus, an absorptiometer that measures the water concentration in the water-based resist stripping liquid and an electrical conductivity meter that measures the degraded component concentration in the water-based resist stripping liquid are connected to a resist stripping treatment bath (adjusting bath) via pipelines, and at least one of a resist stripping stock liquid, a resist stripping reclaimed liquid, pure water, and a premixed resist stripping new liquid are fed into the resist stripping treatment bath in accordance with the measurement values obtained. As a result, the resist stripping performance of the water-based resist stripping liquid can be stably maintained, the amount of liquid used can be reduced, and the time for which operation is shut down can be reduced.

1 Claim, 6 Drawing Sheets

OTHER PUBLICATIONS

Yoshitaka e al., JP 08-146622, Jun. 7, 1996, computer translation.*
Toshimoto et al., JP 11-133630, May 21, 1999, computer translation.*
Toshimoto et al., JP 08-193005, published Jan. 23, 1998, computer translation.*
Notice of Rejection for Patent Application No. 191703/2001 dated Dec. 22, 2003, 6 pages.
Abstract of Publication No. 2000-338684 dated Dec. 8, 2000, 2 pages.
Abstract of Publication No. 11-133630 dated May 21, 1999, 2 pages.
Abstract of Publication No. 10-022261 dated Jan. 23, 1998, 2 pages.
Abstract of Publication No. 2001-223153 dated Aug. 17, 2001, 2 pages.
Patent Abstracts of Japan, Publication No. 07-235487, Publication Date: Sep. 5, 1995, 1 page.
Patent Abstracts of Japan, Publication No. 10-022261, Publication Date: Jan. 23, 1998, 1 page.
Patent Abstracts of Japan; Publication No. 11-133630, dated May 21, 1999; Appl. No. 09-311403, dated Oct. 27 1997; 2 pages.
Patent Abstracts of Japan; Publication No. 2000-338684, dated Dec. 8, 2000; Appl. No. 11-146210, dated May 26, 1999; 2 pages.
English translation of Patent Abstracts of Japan, Publication No. 10-022261, dated Jan. 23, 1998, Application No. 08-193005, filed Jul. 2, 1996 (1 page).

* cited by examiner

| TREATMENT TIME (DAYS) | ACTIVE MEA CONCENTRATION (wt%) | DEACTIVATED MEA CONCENTRATION (wt%) | CARBAMIC ACID CONCENTRATION (CALCULATED VALUE) (wt%) |
|---|---|---|---|
| 0 | 18.83 | 0.00 | 0.00 |
| 1 | 18.90 | 0.00 | 0.00 |
| 7 | 18.89 | 0.64 | 1.10 |
| 11 | 18.60 | 0.90 | 1.55 |
| 19 | 18.63 | 1.32 | 2.27 |
| 23 | 18.15 | 1.59 | 2.74 |

| TREATMENT TIME (DAYS) | ACTIVE MEA CONCENTRATION (wt%) | DEACTIVATED MEA CONCENTRATION (wt%) | CARBAMIC ACID CONCENTRATION (CALCULATED VALUE) (wt%) |
|---|---|---|---|
| 0 | 18.83 | 0.00 | 0.00 |
| 1 | 18.93 | 0.00 | 0.00 |
| 7 | 19.04 | 0.38 | 0.65 |
| 11 | 18.23 | 0.84 | 1.45 |
| 19 | 18.01 | 1.04 | 1.79 |
| 23 | 17.54 | 1.20 | 2.07 |

| TREATMENT TIME (DAYS) | ACTIVE MEA CONCENTRATION (wt%) | DEACTIVATED MEA CONCENTRATION (wt%) | CARBAMIC ACID CONCENTRATION (CALCULATED VALUE) (wt%) |
|---|---|---|---|
| 0 | 18.49 | 0.00 | 0.00 |
| 4 | 19.08 | 0.00 | 0.00 |
| 8 | 19.22 | 0.00 | 0.00 |
| 11 | 18.25 | 0.63 | 1.08 |

| TREATMENT TIME (DAYS) | ACTIVE MEA CONCENTRATION (wt%) | DEACTIVATED MEA CONCENTRATION (wt%) | CARBAMIC ACID CONCENTRATION (CALCULATED VALUE) (wt%) |
|---|---|---|---|
| 0 | 18.83 | 0.00 | 0.00 |
| 1 | 18.93 | 0.00 | 0.00 |
| 7 | 16.45 | 0.00 | 0.00 |

WATER-BASED RESIST STRIPPING LIQUID MANAGEMENT APPARATUS AND WATER-BASED RESIST STRIPPING LIQUID MANAGEMENT METHOD

BACKGROUND OF THE INVENTION

1. Field of the Invention

The present invention relates to a management apparatus and management method for a water-based resist stripping liquid used in the stripping of resists in a semiconductor manufacturing process or the like.

2. Description of the Related Art

A resist material used in a photolithography step in a semiconductor manufacturing process or a flat panel display substrate manufacturing process maybe a positive type that becomes soluble upon exposure to light or a negative type that becomes insoluble upon exposure to light, although it is the positive type that is used predominantly. A typical example of a positive type resist has as principle components thereof a naphthoquinone diazido type photosensitizer and an alkali-soluble resin (novolac resin).

In the final stage of the photolithography step, it is necessary to completely strip the resist from the substrate. This resist stripping process for a semiconductor or a flat panel display substrate includes both a dry ashing step using an oxygen plasma and a wet stripping step using a resist stripping liquid. During the dry ashing step using the oxygen plasma, silicon oxide and/or aluminum oxide is produced on the substrate, and hence in the subsequent wet stripping step it is necessary not only to strip the resist but also to completely remove such metal oxides.

Regarding the above, Japanese Patent Application Laid-open No. 7-235487 discloses a resist stripping liquid management apparatus that comprises resist stripping liquid discharge means that detects the concentration of resist dissolved in a resist stripping liquid using an absorption photometer and discharges the resist stripping liquid, first replenishing means that detects the liquid surface level of the resist stripping liquid using a liquid surface level gauge and replenishes with organic solvent and ailcanolainine, or replenishes with resist stripping new liquid in which the organic solvent and the alkanolamine have been premixed, and second replenishing means that detects the concentration of the alkanolamine in the resist stripping liquid and replenishes with at least one of the organic solvent and the alkanolamine.

Moreover, Japanese Patent Application Laid-open No. 10-22261 discloses a resist stripping liquid management apparatus that comprises resist stripping liquid discharge means that detects the concentration of resist dissolved in a resist stripping liquid using an absorption photometer and discharges the resist stripping liquid, first replenishing means that detects the liquid surface level of the resist stripping liquid using a liquid surface level gauge and replenishes with resist stripping stock liquid and pure water or replenishes with resist stripping new liquid in which the resist stripping stock liquid and pure water have been premixed, and second replenishing means that detects the water concentration in the resist stripping liquid using an absorption photometer and replenishes with at least one of the resist stripping stock liquid and pure water.

In the resist stripping process for a semiconductor or a flat panel display substrate, it is common to use a solution containing an organic alkali or an organic solvent as the resist stripping liquid, and it has become clear that such a solution to which a suitable amount of water has been added exhibits excellent effects. Specifically, with a resist stripping liquid containing a suitable amount of water (water-based resist stripping liquid), it is possible to reduce the substrate treatment temperature from about 80° C. to about 40° C., and thus alleviate undesirable effects on the metal that forms the foundation of the substrate or semiconductor circuit. Moreover, a water-based resist stripping liquid has advantages such as being handleable as a noncombustible material, having high stability, loss due to evaporation being predominantly that of water, which is inexpensive, and the resist stripping rate being high.

Examples of such a water-based resist stripping liquid include a mixed solution of a dimethylsulfoxide and pure water, a mixed solution of an N-methylpyrrolidone derivative and pure water, and a mixed solution of an alkanolamine, glycol ether and pure water. These water-based resist stripping liquids are used with a spraying method, a dipping method or the like.

SUMMARY OF THE INVENTION

With the prior art described above, however, a batch operation format is used in which a resist stripping treatment bath is filled with a certain amount of resist stripping new liquid of a prescribed concentration and operation is begun, and then using the number of substrates treated or the like as an indicator based on experience or the like, once the amount of the resist stripping liquid has dropped and a prescribed degraded concentration range has been reached, all of the resist stripping liquid is replaced with pre-prepared new liquid.

The frequency with which the replacement of the resist stripping liquid is carried out is not fixed, depending on the volume of the bath, the substrate type, the number of substrates treated and so on, but is usually about once every 4 days. If the resist stripping liquid degrades, then it will not be possible to obtain a constant stripping rate, and stripping residue and metal oxide residue will arise, resulting in the yield dropping. The financial loss is great if defective articles arise in this way in the resist stripping process, which is the final stage of the photolithography step.

Moreover, a water-based solution used as a resist stripping liquid is generally used at a temperature in a range of 30 to 65° C. The boiling points of the components used in the resist stripping liquid are about 160 to 250° C. for the organic alkali or organic solvent and 100° C. for the water. The water, which has the lower boiling point, thus evaporates preferentially into the exhaust gas that is discharged in a large amount from the resist stripping treatment bath during use of the resist stripping liquid, and hence the water concentration in the resist stripping liquid drops, i.e. changes in this concentration occur. The resist stripping performance thus progressively drops, and yet conventionally the water concentration has not been measured continuously in real time, and moreover control has not been carried out to make the water concentration constant.

Moreover, monoethanolamine (hereinafter referred to as 'MEA'), which is an alkali, is degraded by reaction with acid in the dissolved resist, reaction with carbon dioxide absorbed from the air to produce a degradation product (carbamic acid and derivatives thereof), a decomposition reaction and so on.

Furthermore, the concentration of resist that has dissolved in the resist stripping liquid through the resist stripping treatment progressively increases, and this is one cause of the degradation of the resist stripping performance. That is, as the dissolved resist concentration increases, the resist stripping rate drops, and also stripping residue is generated, and hence the resist stripping performance drops. In addition, a large amount of gas is exhausted from out of the resist stripping treatment apparatus, and hence a corresponding large amount of air is sucked in, which further promotes the degradation described above.

Degraded components in the resist stripping liquid thus include dissolved resist, degradation products produced through the alkali MEA reacting with carbon dioxide absorbed from the air, and other byproducts and the like. However, conventionally the concentration of these degraded components has not been measured continuously in real time, and moreover control has not been carried out to make the degraded component concentration constant.

With the prior art described above, the water concentration, the MEA concentration and the degraded component concentration are thus not constant but rather change with time, and hence metal oxide residue and stripping residue from the resist are generated, or a thin film residue of degraded components arises, and thus highly precise control of dimensions, which is considered to be necessary in the manufacture of flat panel display substrates and the like, has tended to be difficult. There has thus been a problem that the product quality becomes unstable, and the yield drops. Moreover, there has been the disadvantage that shutting down operation ('down time') during replacement of the resist stripping liquid leads to a drop in operation rate, and the work of replacing the resist stripping liquid results in an increase in labor costs.

In view of this state of affairs, it is an object of the present invention to provide a water-based resist stripping liquid management apparatus and method, according to which control is carried out such that the water concentration and the degraded component concentration in the water-based resist stripping liquid are constant, and suitable management of replenishment of liquid into the resist stripping treatment bath is carried out, and hence the resist stripping performance can be made constant, and moreover the amount used of the water-based resist stripping liquid can be reduced, and the time for which operation is shut down can be reduced, and hence overall costs can be reduced.

The present inventors carried out assiduous studies to attain the above object, and as a result discovered that a water-based resist stripping liquid degrades by reacting for example with oxygen, carbon dioxide or the like in the air to produce various acids, salts and oxides thereof and the like, thus accomplishing the present invention. Specifically, the water-based resist stripping liquid management apparatus according to the present invention, which is an apparatus that manages in an adjusting bath a water-based resist stripping liquid that is used in resist stripping equipment, comprises degraded component concentration measurement means for measuring the concentration of a degraded component in the water-based resist stripping liquid in the adjusting bath, liquid feeding means for feeding into the adjusting bath at least one of a water-based resist stripping stock liquid, a water-based resist stripping reclaimed liquid, pure water, and a premixed water-based resist stripping new liquid, and liquid feeding amount control means for controlling the amount, of liquid fed into the adjusting bath in accordance with the measured degraded component concentration.

According to the water-based resist stripping liquid management apparatus having such a constitution, the concentration of a degraded component in the water-based resist stripping liquid in the adjusting bath is measured, and the amount of liquid fed into the adjusting bath is controlled in accordance with this measured degraded component concentration. As a result, the water concentration and the degraded component concentration in the water-based resist stripping liquid can be maintained at desired target values, and continuous operation for a prolonged time with a stable liquid surface level becomes possible.

Moreover, it is preferable that the degraded component contains dissolved resist and chemical component that has arisen through reaction of a constituent component of the water-based resist stripping liquid in the adjusting bath and/or a decomposition product of such a constituent component with oxygen and/or carbon dioxide in a gas containing oxygen and/or carbon dioxide.

If such a constitution is adopted, then by measuring the degraded component concentration, it becomes possible to measure the extent of degradation of the water-based resist stripping liquid. According to the understanding of the present inventors, in the case for example that organic acids produced from constituent components or the like of the water-based resist stripping liquid, or oxides (oxidation products) thereof are present, examples of the above-mentioned chemical species or chemical component in the degraded component include reaction products of these acids, and salts and oxides thereof.

Alternatively, it is also preferable for the degraded component concentration measurement means to comprise an electrical conductivity meter that measures the electrical conductivity of the water-based resist stripping liquid in the adjusting bath.

In studies carried out by the present inventors, it was verified that the concentration of degraded components dissolved in the water-based resist stripping liquid in the resist stripping treatment bath is correlated to the electrical conductivity of the water-based resist stripping liquid (there is a highly linear relationship). By measuring the electrical conductivity of the water-based resist stripping liquid in the adjusting bath, it is thus possible to ascertain the degraded component concentration, and hence it becomes possible to measure the extent of degradation of the water-based resist stripping liquid.

Moreover, the water-based resist stripping liquid management method according to the present invention, which is a method of managing in an adjusting bath a water-based resist stripping liquid that is used in resist stripping equipment, and which can be implemented effectively using the water-based resist stripping liquid management apparatus of the present invention, comprises a degraded component concentration measurement step of measuring the concentration of a degraded component in the water-based resist stripping liquid in the adjusting bath, a liquid feeding step of feeding into the adjusting bath at least one of a water-based resist stripping stock liquid, a water-based resist stripping reclaimed liquid, pure water, and a premixed water-based resist stripping new liquid, and a liquid feeding amount control step of controlling the amount of liquid fed into the adjusting bath in accordance with the measured degraded component concentration.

According to such a water-based resist stripping liquid management method, the concentration of a degraded component in the water-based resist stripping liquid in the adjusting bath is measured, and the amount of liquid fed into the adjusting bath is controlled in accordance with the measured degraded component concentration. As a result, the water concentration and the degraded component concentration in the water-based resist stripping liquid can be maintained at desired target values, and continuous operation for a prolonged time with a stable liquid surface level becomes possible.

Moreover, it is preferable that the degraded component contains dissolved resist and a chemical species or chemical component that has arisen through reaction of a constituent component of the water-based resist stripping liquid in the adjusting bath and/or a decomposition product of such a constituent component with oxygen and/or carbon dioxide in a gas containing oxygen and/or carbon dioxide. Alternatively, in the degraded component concentration measurement step, it is also preferable for the electrical conductivity of the water-based resist stripping liquid in the adjusting bath to be measured.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 10A is a table showing an example of the relationship between the treatment time passed, the active MEA concentration, the deactivated MEA concentration, and the 2-hydroxyethylcarbamic acid concentration, for the case of treatment using a water-based resist stripping liquid at 40° C.;

FIG. 10B is a table showing an example of the relationship between the treatment time passed, the active MEA concentration, the deactivated MEA concentration, and the 2-hydroxyethylcarbamic acid concentration, for the case of treatment using a water-based resist stripping liquid at 60° C.;

FIG. 10C is a table showing an example of the relationship between the treatment time passed, the active MEA concentration, the deactivated MEA concentration, and the 2-hydroxyethylcarbamic acid concentration, for the case of treatment using a water-based resist stripping liquid at 70° C.; and FIG. 10D is a table showing an example of the relationship between the treatment time passed, the active MEA concentration, the deactivated MEA concentration, and the 2-hydroxyethylcarbamic acid concentration, for the case of treatment using a water-based resist stripping liquid at 80° C.

DESCRIPTION OF THE PREFERRED EMBODIMENTS

Figure 1:
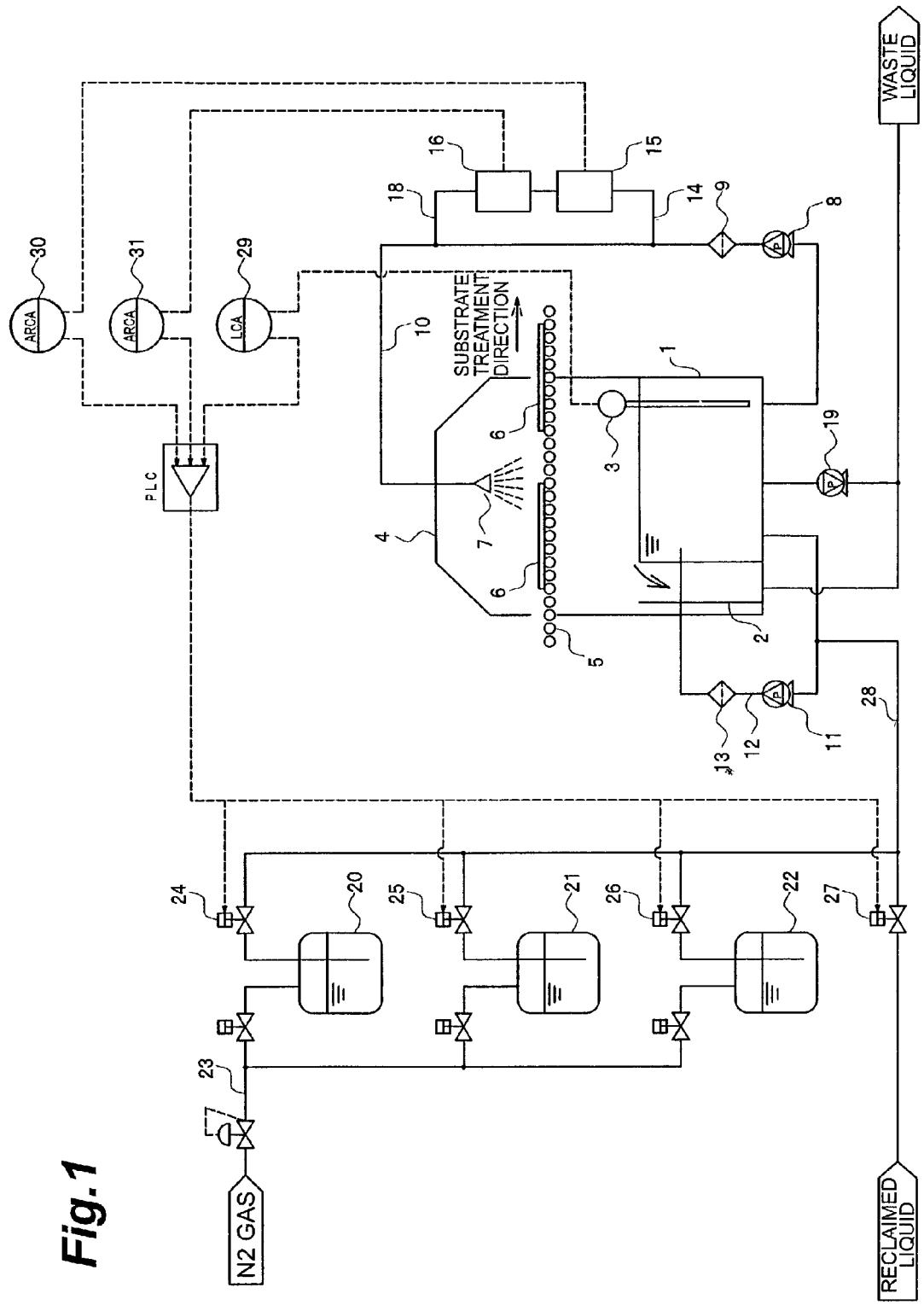
FIG. 1 is a diagram showing the constitution of a preferable embodiment of the water-based resist stripping liquid management apparatus according to the present invention.

Before an embodiment of the present invention is described, an outline description will be given of matters relating to degraded components in the water-based resist stripping liquid and management of the concentration thereof.

As described above, the present inventors discovered that a water-based resist stripping liquid degrades by reacting for example with oxygen, carbon dioxide or the like in the air to produce various acids, salts and oxides thereof and the like. In the present invention, degraded components in the water-based resist stripping liquid refers to dissolved resist and chemical species or chemical components that have arisen through reaction of constituent components of the water-based resist stripping liquid in the adjusting bath and/or decomposition products of such constituent components with oxygen and/or carbon dioxide in a gas containing oxygen and/or carbon dioxide.

In the case for example that organic acids produced from the constituent components or the like of the water-based resist stripping liquid or oxides thereof are present, examples of such degraded components include reaction products of these acids or oxides.

More specifically, an example is 2-hydroxyethylcarbamic acid, which is the final product of such a reaction. The present inventors have realized that this 2-hydroxyethylcarbamic acid only dissolves at a concentration of up to about 5% in a water-based resist stripping liquid (MEA/BDG (butyl diglycol) aqueous solution), and thus causes separation of the stripping liquid into two phases, and moreover is produced through reaction between MEA and $CO_2$.

Moreover, FIGS. 10A to 10D are tables showing examples of the relationship between the treatment time passed, the active MEA concentration, the deactivated MEA concentration, and the 2-hydroxyethylcarbamic acid concentration, for treatment using a water-based resist stripping liquid at 40° C., 60° C., 70° C. and 80° C. respectively. From these tables, it can be seen that at 40° C., 60° C. and 70° C., the deactivated MEA concentration increases as the treatment time passes, and together with this the 2-hydroxyethylcarbamic acid concentration also increases. It can be seen that with high-temperature treatment at 80° C. or above, 2-hydroxyethylcarbamic acid does not tend to be produced, the reason being that $CO_2$ is evolved.

Note that in the tables, the 2-hydroxyethylcarbamic acid concentrations are calculated values calculated as deactivated MEA concentration)×105/61. Here, the molecular weights are 61 for MEA, 44 for $CO_2$, and 105 for (MEA+ $CO_2$). Furthermore, in studies carried out by the present inventors, it was also found that MEA is consumed through reaction with $CO_2$, with the amount of MEA dropping.

In the reaction producing 2-hydroxyethylcarbamic acid, MEA, which is represented by undermentioned formula (1), reacts with carbon dioxide ($CO_2$) to produce 2-hydroxyethylcarbamic acid, which is represented by undermentioned formula (2).

$$NH_2CH_2CH_2OH \qquad (1)$$

$$(HOOC)\,NHCH_2CH_2OH \qquad (2)$$

Moreover, as described later, the present inventors found experimentally that the concentration of degraded components dissolved in the water-based resist stripping liquid in the resist stripping treatment bath is correlated to the electrical conductivity of the water-based resist stripping liquid (there is a highly linear relationship) (see FIG. 5). In the present invention, it is thus effective to obtain the degraded component concentration by measuring the electrical conductivity of the water-based resist stripping liquid and carry out adjustment/control accordingly.

Furthermore, the present inventors also found experimentally that there is a correlation (a highly linear relationship) between the water concentration in the water-based resist stripping liquid and the absorbance of the water-based resist stripping liquid. In the present invention, it is thus effective to obtain the water concentration by measuring the absorbance of the water-based resist stripping liquid and carry out adjustment/control accordingly. Note that instead of measuring the absorbance, the water concentration may alternatively be measured by automatic titration using the Karl Fischer method or the like.

As the resist stripping stock liquid in the present invention, for example a dimethylsulfoxide type stock liquid, an N-methylpyrrolidone type stock liquid, a diglycol type stock liquid, a mixed stock liquid of an alkanolamine and a glycol ether type solvent, one of these stock liquids with pure water and/or any of various additives added thereto, or the like can be used.

Examples of the alkanolamine include monoethanolamine, diethanolamine, triethanolamine, N,N-dimethylethanolamine, N,N-diethylethanolamine, aminoethylethanolamine, N-methyl-N,N-diethanolamine, N,N-dibutylethanolamine, N-methylethanolamine, and 3-amino-1-propanol.

Furthermore, examples of the glycol ether type solvent include butyl diglycol, diethylene glycolmonomethyl ether, diethylene glycol monoethyl ether, and diethylene glycol monopropyl ether.

Moreover, additives include catechol, reducing agents, metal corrosion inhibitors, and chelating agents.

Following is a detailed description of an embodiment of the present invention. Note that equivalent elements are given the same reference numeral, and redundant repeated description is omitted. Moreover, positional relationships such as above, below, left and right follow the positional relationships shown in the drawings unless otherwise stated. Furthermore, the ratios of dimensions are not limited to being those shown in the drawings.

FIG. 1 is a diagram showing the constitution of a preferable embodiment of the water-based resist stripping liquid management apparatus according to the present invention. The water-based resist stripping liquid management apparatus of the present embodiment has a resist stripping treatment bath 1 (adjusting bath) which is installed below a roller conveyor 5 on which substrates 6 such as semiconductor wafers are placed and conveyed, and in which a water-based resist stripping liquid is stored, and a resist stripping liquid sprayer 7 that is disposed within a resist stripping chamber hood 4 above the roller conveyor 5 and is connected to the resist stripping treatment bath 1 via a pipeline 10.

The resist stripping treatment bath 1 is connected to a pipeline 12 in which are provided a circulating pump 11 and a filter 13 for removing fine particles, and the water-based resist stripping liquid is made to circulate as a result. Moreover, a pipeline 28 is connected to the pipeline 12, and a resist stripping stock liquid supply vessel 20, a resist stripping reclaimed liquid supply vessel 21, a resist stripping new liquid supply vessel 22 and a pure water supply system are connected to the pipeline 28 via pipelines in which are provided flow rate control valves 24 to 27 respectively. The resist stripping stock liquid supply vessel 20, the resist stripping reclaimed liquid supply vessel 21, the resist stripping new liquid supply vessel 22, the pure water supply system, the flow rate control valves 24 to 27, and the pipeline 28 together constitute the liquid feeding means. Note that the resist stripping reclaimed liquid is used water-based resist stripping liquid that has been reclaimed using for example a distillation reclamation method, or a membrane separation reclamation method using an NF membrane or the like.

An $N_2$ gas supply system is connected to the resist stripping stock liquid supply vessel 20, the resist stripping reclaimed liquid supply vessel 21 and the resist stripping new liquid supply vessel 22 via piping 23. The resist stripping stock liquid supply vessel 20, the resist stripping reclaimed liquid supply vessel 21 and the resist stripping new liquid supply vessel 22 are each pressurized to about 1 to 2 kgf/cm$^2$ with $N_2$ gas from the piping 23. By opening the flow rate control valve 24 for the resist stripping stock liquid, the flow rate control valve 25 for the resist stripping reclaimed liquid, and the flow rate control valve 26 for the resist stripping new liquid by prescribed opening amounts, the resist stripping stock liquid (for example a mixed liquid of MEA and BDG of prescribed concentrations), the resist stripping reclaimed liquid and the resist stripping new liquid are fed under pressure into the resist stripping treatment bath 1. Furthermore, by opening the flow rate control valve 27 for pure water by a prescribed opening amount, pure water is fed into the resist stripping treatment bath 1 via the pipeline 28.

The feeding amounts of the above replenishing liquids are adjusted using the respective flow rate control valves 24 to 27. The replenishing liquids flow together at the pipeline 28 and flow into the pipeline 12, and are then mixed with the circulating flow of the water-based resist stripping liquid, before being fed into the resist stripping treatment bath 1. Note that it is also possible to make each of the replenishing liquids flow directly into the pipeline 12 or the resist stripping treatment bath 1, without making the replenishing liquids flow together first.

Moreover, regarding the liquids replenished into the resist stripping treatment bath 1, it is not necessarily the case that all of the resist stripping stock liquid, the resist stripping reclaimed liquid, the resist stripping new liquid and the pure water are required; rather, depending on the composition of the water-based resist stripping liquid, the extent of concentration changes, equipment conditions, operating conditions, availability of the replenishing liquids and so on, one may select one or more of the above replenishing liquids as the most suitable replenishing liquid(s). Furthermore, the amount of liquid stored in the resist stripping treatment bath 1 only needs to be such that the required amount can be fed to the resist stripping liquid sprayer 7, but it is preferable to control the amount of liquid fed into the resist stripping treatment bath 1 from the viewpoint of implementing the process stably.

Moreover, a liquid surface level gauge 3, which is connected to a liquid surface level controller 29, is installed in the resist stripping treatment bath 1. During the resist stripping treatment of the substrates 6, there is a tendency for the water-based resist stripping liquid to stick to the substrates 6 and thus be taken outside the system, resulting in the amount of liquid in the resist stripping treatment bath 1 dropping. Dropping of the liquid surface level in the resist stripping treatment bath 1 due to this, or dropping of the liquid surface level when water-based resist stripping liquid for which the resist stripping performance has degraded is forcibly discharged to the outside of the resist stripping treatment bath 1, is thus detected by the liquid surface level gauge 3, and the amount of liquid in the resist stripping treatment bath 1 is controlled so as to be within a fixed range based on the detected value.

Furthermore, an overflow bath 2 is provided next to the resist stripping treatment bath 1, and drainage piping, which has therein a liquid discharge pump 19 and is connected to a waste liquid system, is connected to the resist stripping treatment bath 1 and the overflow bath 2. By operating the liquid discharge pump 19, water-based resist stripping liquid for which the resist stripping performance has degraded (i.e. degraded liquid) is made to flow down into the drainage piping. Note that it is also possible to make the constitution such that degraded liquid is discharged out of the system directly without passing through drainage piping.

Moreover, a liquid feeding pump 8 that pumps the water-based resist stripping liquid from the resist stripping treatment bath 1 to the resist stripping liquid sprayer 7, and a filter 9 for removing fine particles and the like from the resist stripping liquid, are provided in this order in the pipeline 10. Furthermore, downstream of the filter 9, a pipeline 14 splits off from the pipeline 10; an absorption photometer 15 and an electrical conductivity meter 16 (degraded component concentration measurement means), which are connected to an absorbance controller 30 and an electrical conductivity controller 31 respectively, are provided in the pipeline 14; connected downstream of the absorption photometer 15 and the electrical conductivity meter 16 is a pipeline 18, which connects back to the pipeline 10. Furthermore, the liquid surface level controller 29, the absorbance controller 30 and the electrical conductivity controller 31 are connected to the flow rate control valves 24 to 27 via an input/output apparatus.

The absorption photometer 15 and the electrical conductivity meter 16 installed online in this way measure the absorbance and the electrical conductivity respectively of the water-based resist stripping liquid in the resist stripping treatment bath 1. A sample liquid from the water-based resist stripping liquid is led into the absorption photometer 15 and the electrical conductivity meter 16 from the pipeline 14, the absorbance and the electrical conductivity are measured continuously, and the liquid on which the measurements have been carried out is returned back into the pipeline 10 via the pipeline 18. Note that the absorption photometer 15 and the electrical conductivity meter 16 maybe installed separately between the pipeline 14 and the pipeline 18 as in FIG. 1, or may be integrated with one another.

Moreover, instead of using the circular path formed from the pipelines 14 and 18, the absorption photometer 15 and the electrical conductivity meter 16 maybe installed as separate bodies, or the sample liquid may be led into the absorption photometer 15 and the electrical conductivity meter 16 using a circulating pump for measurement. Furthermore, because there is a highly linear relationship between the MEA concentration and the absorbance, it is also possible to measure the absorbance of the water-based resist stripping liquid using the absorption photometer 15 and then determine the MEA concentration in the water-based resist stripping liquid. Moreover, it is possible to install the absorption photometer 15 and the electrical conductivity meter 16 directly in the resist stripping treatment bath 1, in which case the absorption photometer 15 and the electrical conductivity meter 16 should each be of a probe type.

The absorption photometer 15, the electrical conductivity meter 16, the liquid surface level gauge 3 and so on constitute the control system in the present embodiment. Moreover, the measurement and control of the liquid surface level in the resist stripping treatment bath 1 using the liquid surface level gauge 3, the measurement and control of the water concentration in the water-based resist stripping liquid using the absorption photometer 15, and the measurement and control of the degraded component concentration in the water-based resist stripping liquid using the electrical conductivity meter 16 essentially function independently of one another, but in the present invention there is the characteristic feature that these are made to function with a mutually complementary relationship therebetween. Furthermore, the target value (management value) of the water concentration in the resist stripping liquid, and the degradation limit value (management value) of the degraded component concentration in the resist stripping liquid, that are necessary in terms of quality control of the product substrates are set into the various control instruments in advance based on past operating results or on the results of calculations (for example operation simulations).

Following is a description of the water-based resist stripping liquid management method of the present invention using the water-based resist stripping liquid management apparatus constituted as described above, taking the case of using a mixed solution of MEA and BDG as the water-based resist stripping liquid as an example.

Normally, the water-based resist stripping liquid is used kept at a constant temperature of about 40° C. In this case, water, which has a low boiling point, evaporates preferentially from the water-based resist stripping liquid and is predominantly discharged with the large amount of exhaust gas. As a result, in the conventional method, the water concentration in the water-based resist stripping liquid drops as the number of substrates treated increases, and hence there is a gradual degradation of the resist stripping performance. It is thus necessary to manage the water concentration to be close to a prescribed target value, for example 29.0±1.0%. Conventionally, the extent of degradation of the water-based resist stripping liquid is judged based on a correlation between the extent of degradation and the number of substrates treated obtained from experience or based on the results of chemical analysis or the like on a liquid sample; however, with such a judgment method, it is difficult to carry out judgment quickly and accurately.

Figure 2:
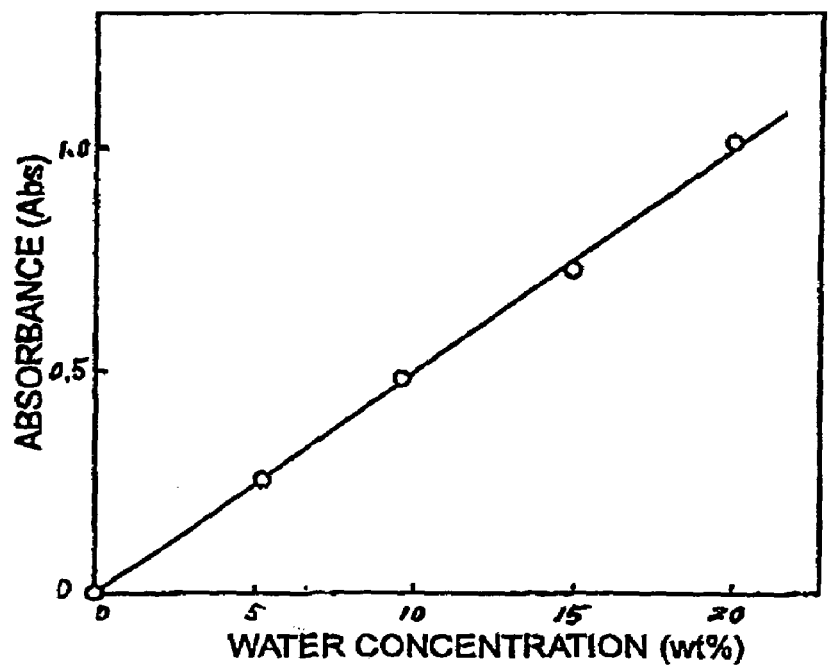
FIG. 2 is a graph showing the relationship between the water concentration in a water-based resist stripping liquid and the absorbance.

In contrast, the present inventors carried out studies focusing on the relationship between the water concentration of the water-based resist stripping liquid and the absorbance of the water-based resist stripping liquid, and as a result ascertained that a near infrared region wavelength in a range of 950 to 2000 nm is suitable as the wavelength at which to measure the absorbance, and in particular a wavelength around 1940 nm is good since then the sensitivity is high. Moreover, it became clear that a suitable wavelength can be selected as appropriate from the near infrared region in accordance with the types of the water-based resist stripping liquid and the resist, the concentration of the water-based resist stripping liquid and so on. FIG. 2 shows an example of the relationship between the absorbance and the water concentration in the case of using probe light of measurement wavelength $\lambda=1940$ nm. It can be seen from FIG. 2 that a high degree of correlation between the water concentration and the absorbance is shown, with there being no effects from degraded components and the like, and hence that the water concentration can be determined accurately by measuring the absorbance.

Furthermore, the present inventors have realized that there is a high degree of correlation between the MEA concentration of the water-based resist stripping liquid and the absorbance. In this case, an appropriate measurement wavelength for the MEA component concentration is $\lambda=1048$ nm. Note, however, that the measurement wavelength is not so limited, but rather can be selected as appropriate from near infrared region wavelengths in a range of 1000 nm to 1600 nm in accordance with the type and concentration of the water-based resist stripping liquid and so on.

The absorption photometer 15 installed online in the pipeline 10 has various compensatory functions for minimizing the measurement error, and the absorbance measurement value of the sample liquid led into the absorption photometer 15 from the pipeline 10 is inputted into the absorbance controller 30. The absorbance controller 30 outputs control signals to the flow rate control valves 24 to 27 based on the difference between the measurement value and a preset target value. As a result, automatic control of each of the flow rate control valves 24 to 27 is carried out, and replenishing liquid is fed into the resist stripping treatment bath 1 as appropriate such that the absorbance of the water-based resist stripping liquid in the resist stripping treatment bath 1 becomes this target value, i.e. such that the water concentration and/or the MEA concentration becomes a target value.

Figure 3:
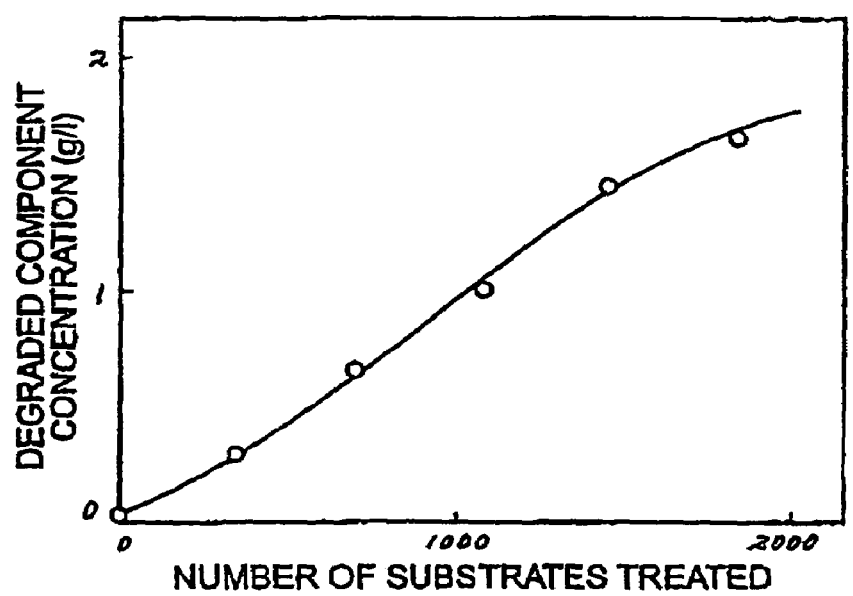
FIG. 3 is a graph showing the relationship between the number of substrates subjected to resist stripping treatment and the degraded component concentration in the water-based resist stripping liquid.

Moreover, degradation of the resist stripping performance is contributed to not lonely by the water concentration as described above but also be the degraded component concentration. Water-based resist stripping liquid is taken out of the resist stripping treatment bath 1 by the liquid feeding pump 8 and used in a circulatory fashion via the resist stripping liquid sprayer 7, and hence the concentration of dissolved substances in the water-based resist stripping liquid gradually increases. The main such dissolved substances are the resist and 2-hydroxyethylcarbamic acid, and as shown in the operation example of FIG. 3, the degraded component concentration increases as the number of substrates 6 treated increases. This will result in a marked drop in the resist stripping performance.

Conventionally, such changes in the degraded component concentration have not been measured constantly in real time, and management of the degraded component concentration has not been carried out such that the resist stripping performance is constant. Specifically, conventionally, the number of substrates 6 treated has been taken as a degradation indicator, but because the substrate shape, the resist film thickness, the resist stripping pattern and the like are not constant, the amount of dissolved resist also differs according to the type of the substrates 6, and hence it is not appropriate to use the number of substrates treated in the judgment of degradation of the resist stripping performance in this way.

Figure 4:
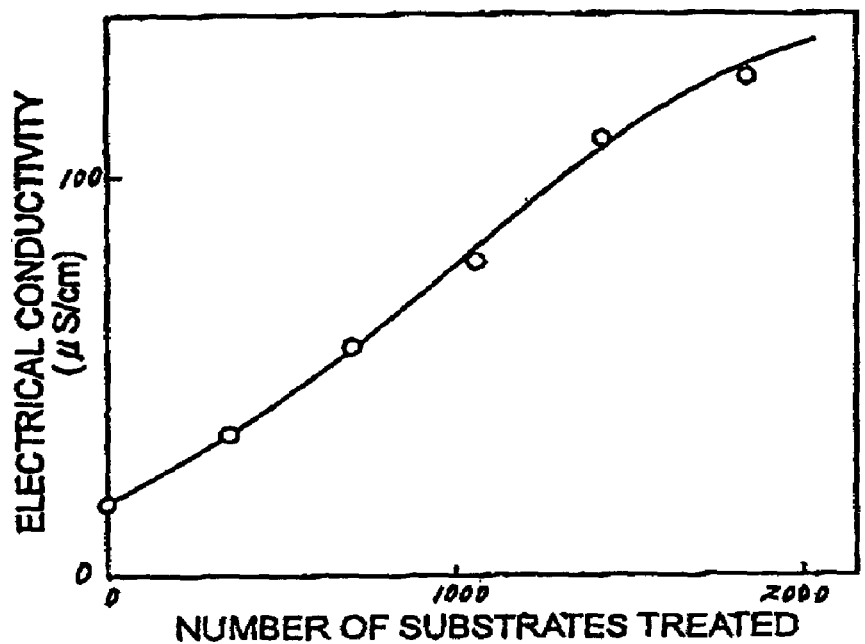
FIG. 4 is a graph showing the relationship between the number of substrates subjected to resist stripping treatment and the electrical conductivity of the water-based resist stripping liquid.
Figure 5:
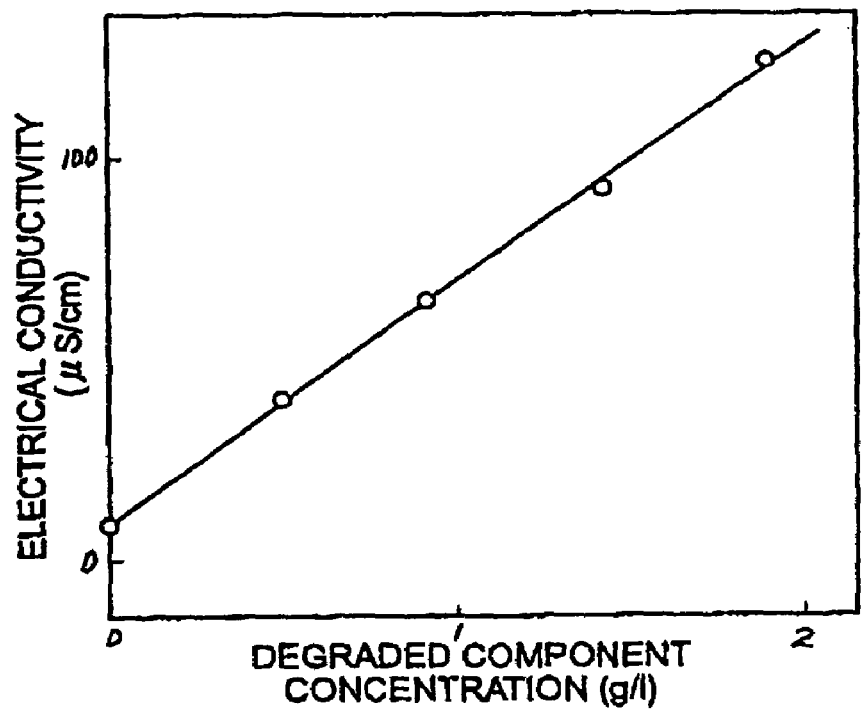
FIG. 5 is a graph showing the relationship between the degraded component concentration in the water-based resist stripping liquid and the electrical conductivity of the water-based resist stripping liquid.

In contrast, the present inventors carried out studies into the state of contamination due to increase in the resist concentration in the water-based resist stripping liquid, and focusing on the relationship between the degraded component concentration in the water-based resist stripping liquid and the electrical conductivity of the water-based resist stripping liquid, obtained as one example the results shown in FIG. 4 and FIG. 5.

As shown in FIG. 5, a high degree of correlation is shown between the degraded component concentration in the water-based resist stripping liquid and the electrical conductivity of the water-based resist stripping liquid, and hence it is possible to carry out limit value judgment for the resist stripping performance from the degraded component concentration itself by measuring and controlling the electrical conductivity, with no regard given to the number of substrates treated.

Consequently, by continuously measuring the electrical conductivity using the electrical conductivity meter 16, which is installed integrated with or separate to the absorption photometer 15 in the pipeline 10, the degraded component concentration in the water-based resist stripping liquid is obtained, and when it is detected that the degradation limit value has been exceeded, fresh resist stripping liquid is replenished into the resist stripping treatment bath 1 based on output signals from the electrical conductivity controller 31. As a result, the degraded component concentration in the water-based resist stripping liquid is reduced to the degradation limit value or below, and hence the resist stripping performance is restored. Note that it is preferable for the measurement of the degraded component concentration to be carried out with the temperature of the water-based resist stripping liquid held constant.

A more detailed description will now be given of the functioning of the control system of the present apparatus. Firstly, when the bath is first made up and the resist stripping treatment bath 1 is empty, the liquid surface level gauge 3 detects that the resist stripping treatment bath 1 is empty, the opening amounts of the flow rate control valves 24 to 27 are adjusted through output signals from the liquid surface level controller 29, and the various replenishing liquids are fed in at appropriate flow amount proportions. Next, the absorption photometer 15 continuously measures the absorbance of the water-based resist stripping liquid during the making up of the bath, the opening amount of at least one of the flow rate control valves 24 to 27 is adjusted through output signals from the absorbance controller 30, and the various replenishing liquids are fed in at appropriate small flow amounts. In this way, automatic control is carried out such that the water concentration in the water-based resist stripping liquid in the resist stripping treatment bath 1 becomes the target value.

When the resist stripping treatment of the substrates 6 is begun, the water concentration in the water-based resist stripping liquid proceeds to drop, the amount of liquid in the resist stripping treatment bath 1 proceeds to drop due to the liquid sticking to the substrates 6 and being taken out of the system, the MEA concentration proceeds to drop, and the concentration of degraded components including dissolved resist proceeds to rise.

When the water concentration has dropped, because the absorption photometer 15 is continuously measuring the absorbance of the water-based resist stripping liquid, the opening amount of the flow rate control valve 27 is adjusted through an output signal from the absorbance controller 30, and pure water is fed in at an appropriate small flow amount, i.e. automatic control is carried out such that the water concentration becomes the target value.

On the other hand, in the case that the amount of liquid in the resist stripping treatment bath 1 has dropped due to the liquid sticking to the substrates 6 and being taken out of the system, the liquid surface level gauge 3 detects the reduced liquid surface level, the opening amount of at least one of the flow rate control valves 24 to 27 is adjusted through output signals from the liquid surface level controller 29, and the various replenishing liquids are fed in at appropriate flow amount proportions.

Moreover, in the case that the MEA concentration has dropped, because an absorption photometer not shown in FIG. 1 or the absorption photometer 15 is continuously measuring the absorbance of the water-based resist stripping liquid, the opening amount of at least one of the flow rate control valves 24 to 27 is adjusted through output signals from an absorbance controller not shown in FIG. 1 or the absorbance controller 30, and the various replenishing liquids are fed in at appropriate small flow amounts, i.e. automatic control is carried out such that the MEA concentration becomes the target value.

Furthermore, in the case that the degraded component concentration has increased and reached the degradation limit value, the electrical conductivity meter 16, which continuously measures the degraded component concentration in the water-based resist stripping liquid, detects that the degradation limit value has been exceeded, the opening amount of at least one of the flow rate control valves 24 to 27 is adjusted through output signals from the electrical conductivity controller 31, and the various replenishing liquids are fed in at appropriate flow amount proportions. In this way, fresh resist stripping liquid is replenished into the resist stripping treatment bath 1, and hence the degraded component concentration is reduced down to the degradation limit value, and thus the resist stripping performance of the water-based resist stripping liquid is restored.

Note that an overflow barrier is provided above the liquid surface level gauge 3 in the resist stripping treatment bath 1 in a position such that overflowing will not occur during normal operation, but it is not a problem if there is slight overflowing over the top of the overflow barrier.

The present inventors found that by carrying out operation control as described above, restoration of the resist stripping performance of the water-based resist stripping liquid, stable continuous operation, and reduction of the amount used of the water-based resist stripping liquid can all be realized.

To aid conceptual understanding, a description will now be given of the operation pattern and the effects exhibited for the apparatus and method of the present invention compared with a conventional method, with reference to FIGS. 6 to 9.

Figure 6:
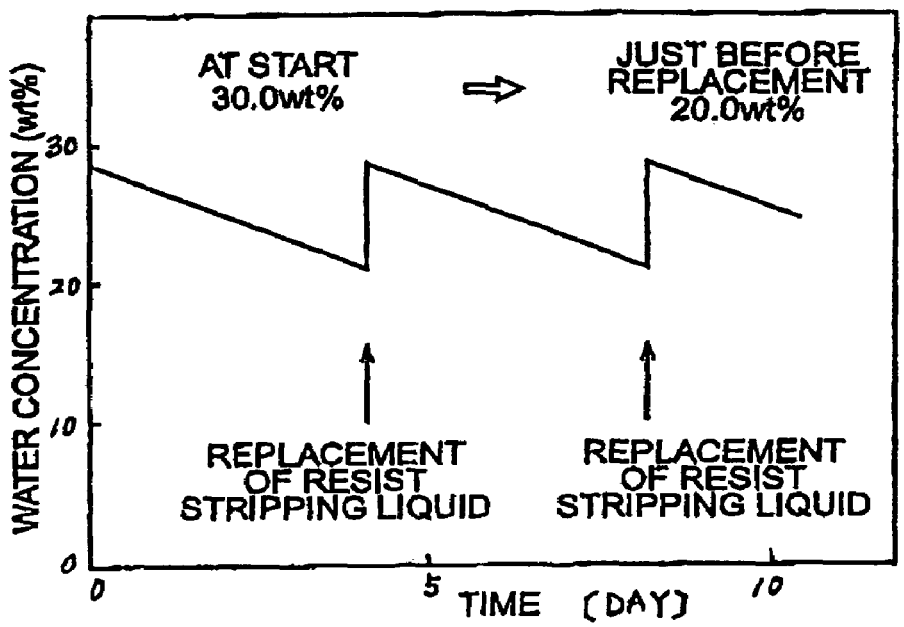
FIG. 6 is a graph showing the relationship between the water concentration in the water-based resist stripping liquid and the operating time in the case of a conventional water-based resist stripping liquid management method.

Firstly, as shown in FIG. 6, with the conventional method, the water concentration in the water-based resist stripping liquid is for example 30.0 wt % when operation is begun, and drops as time passes. The resist stripping liquid is completely replaced once the water concentration has reached for example 20.0 wt % (as measured by chemical analysis). In this case, the graph showing the change in the water concentration with time is sawtooth-shaped (see FIG. 6). There are thus large changes in the water concentration, and hence the resist stripping performance is not constant.

Figure 7:
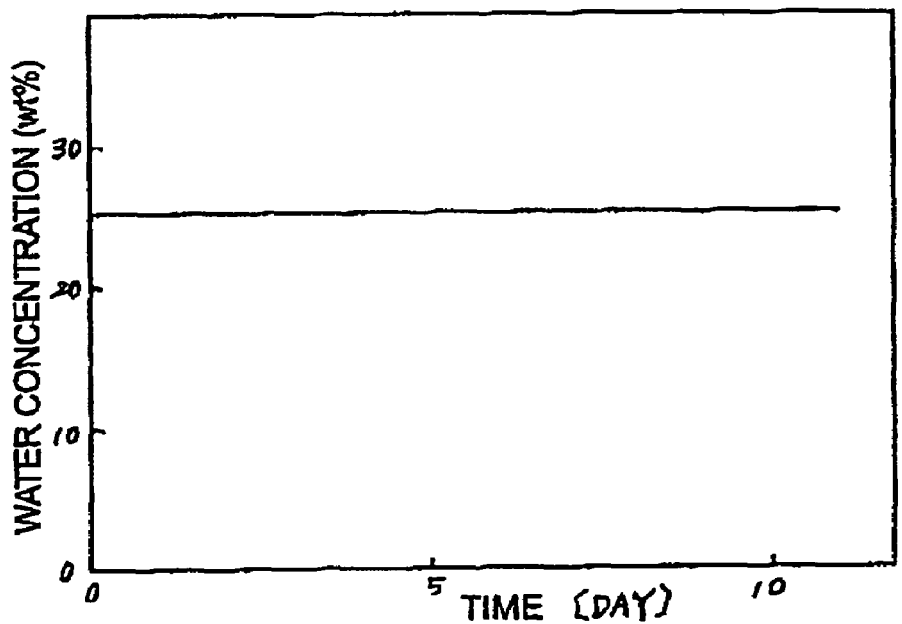
FIG. 7 is a graph showing the relationship between the water concentration in the water-based resist stripping liquid and the operating time in the case of using the water-based resist stripping liquid management apparatus and method according to the present invention.

In contrast, as shown in FIG. 7, according to the apparatus and method of the present invention, the water concentration is kept approximately constant over time at for example 29.0±1.0 wt %. The resist stripping performance is thus made to be stable, and moreover the work of replacing the resist stripping liquid becomes unnecessary.

Figure 8:
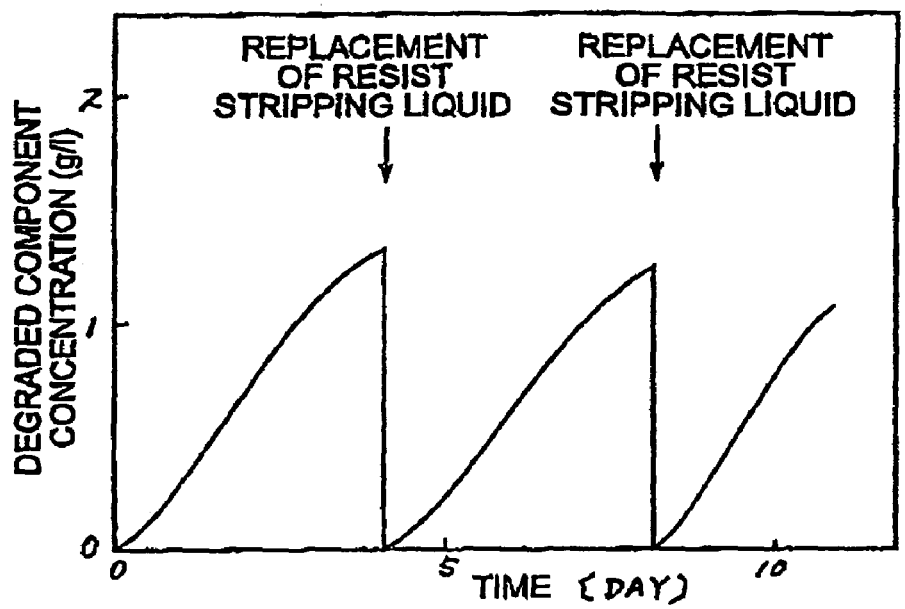
FIG. 8 is a graph showing the relationship between the degraded component concentration in the water-based resist stripping liquid and the operating time in the case of the conventional water-based resist stripping liquid management method.

Moreover, as shown in FIG. 8, with the conventional method, the degraded component concentration in the water-based resist stripping liquid increases with time after operation has begun, and replacement of the resist stripping liquid is carried out once this concentration has reached the limit value (domain value) at which the resist stripping performance has dropped to an unacceptable level. In this case, the graph showing the change in the degraded component concentration with time is sawtooth-shaped (see FIG. 8). There are thus large changes in the degraded component concentration, and hence the resist stripping performance is not constant.

Figure 9:
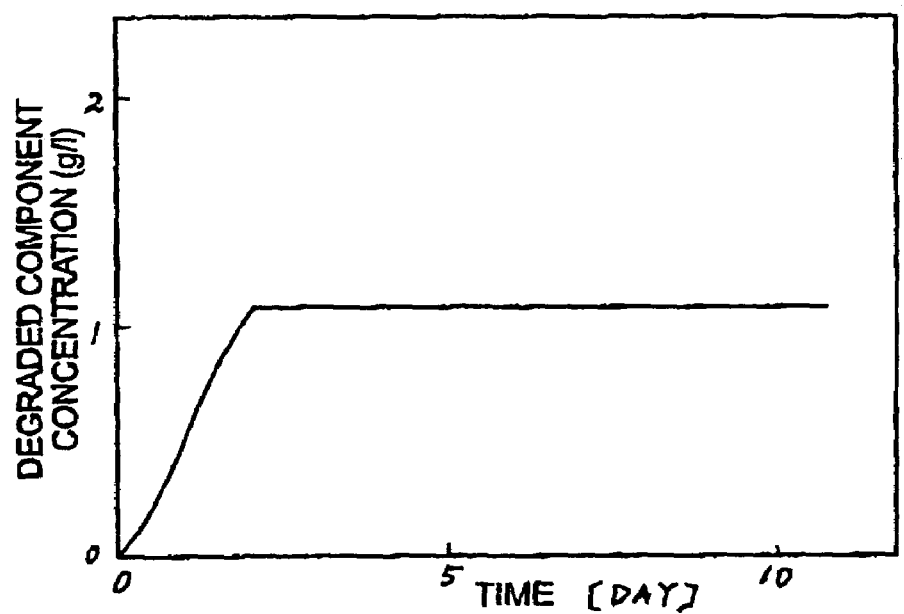
FIG. 9 is a graph showing the relationship between the degraded component concentration in the water-based resist stripping liquid and the operating time in the case of using the water-based resist stripping liquid management apparatus and method according to the present invention.

In contrast, as shown in FIG. 9, according to the apparatus and method of the present invention, the degraded component concentration becomes approximately constant after a certain initial time period has passed. The resist stripping performance is thus made to be stable, and moreover the work of replacing the resist stripping liquid becomes unnecessary.

Note that the present invention is not limited to the embodiment described above, but rather various modifications are possible provided that the purport of the present invention is not deviated from. For example, instead of using a mixed solution of BDG and MEA as the water-based resist stripping liquid, it is possible to use a mixed solution of another organic solvent and MEA. Moreover, the present invention cannot only be applied to a single piece of resist stripping equipment, but it is also possible to adopt a form in which a water-based resist stripping liquid used with a plurality of pieces of resist stripping equipment is brought into and managed in a common adjusting bath (resist stripping treatment bath 1). Furthermore, it is also possible to provide a plurality of adjusting baths (resist stripping treatment baths 1 etc.), and carry out management of the resist stripping liquid in each of the baths.

Furthermore, in place of the electrical conductivity meter 16 for measuring the degraded component concentration, it is also possible to use one or more of a viscometer, a pH meter, an ultrasonic concentration meter, a liquid densitometer, a refractometer, an automatic titration apparatus and so on. Moreover, the measurement of the amount of liquid in the resist stripping treatment bath 1 can also be carried out by measuring the volume or weight of the liquid.

As described above, according to the water-based resist stripping liquid management apparatus and method of the present invention, the water concentration and the degraded component concentration in a water-based resist stripping liquid can be constantly monitored and controlled so as to be target values, and moreover continuous operation over a prolonged time with a stable liquid surface level becomes possible. Moreover, the quality of the resist stripping liquid can be controlled so as to be constant, and hence the resist stripping performance can be made stable. As a result, it becomes possible to greatly reduce the amount of resist stripping liquid used, to increase the yield, to reduce the time for which operation is shut down, and to reduce labor costs.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A water-based resist stripping liquid management method of managing a water-based resist stripping liquid in an adjusting bath that is used in resist stripping equipment, wherein the water concentration of the water-based resist stripping liquid changes due to the evaporation of water, the method comprising:

measuring a water concentration in the water-based resist stripping liquid in said adjusting bath, wherein the water concentration is obtained from a measured absorbance of the water-based resist stripping liquid in said adjusting bath and a calibration curve for relating the absorbance to the water concentration;

measuring the concentration of a degraded component in the water-based resist stripping liquid in said adjusting bath, wherein the concentration of the degraded component is obtained from a measured electrical conductivity of the water-based resist stripping liquid in said adjusting bath and a calibration curve for relating the electrical conductivity to the concentration of the degraded component;

feeding into said adjusting bath at least one of a fresh water-based resist stripping liquid, a reclaimed water-based resist stripping reclaimed liquid, and pure water; and controlling the amount of liquid fed into said adjusting bath in accordance with the measured degraded component concentration and the measured water concentration, wherein the wavelength of the measured absorbance is about 1940 nm.

* * * * *